United States Patent [19]

Katz

[11] Patent Number: 5,089,438
[45] Date of Patent: Feb. 18, 1992

[54] METHOD OF MAKING AN ARTICLE COMPRISING A TIN$_X$ LAYER

[75] Inventor: Avishay Katz, Westfield, N.J.
[73] Assignee: AT&T Bell Laboratories, Murray Hill, N.J.
[21] Appl. No.: 691,956
[22] Filed: Apr. 26, 1991
[51] Int. Cl.$^5$ .......................................... H01L 21/283
[52] U.S. Cl. .................... 437/184; 437/190; 148/DIG. 126
[58] Field of Search ............... 437/184, 192, 190, 176, 437/177, 173; 357/67; 427/255.2; 148/DIG. 26

[56] References Cited

FOREIGN PATENT DOCUMENTS 0174743 3/1986 European Pat. Off. ......... 427/255.2
0370775 5/1990 European Pat. Off. .

OTHER PUBLICATIONS

"Characteristics of a Poly-Silicon Contact Plug Technology", by J. Klein et al., Proceedings of the 6th International IEEE VLSI Multilevel *Interconnection Conference*, Jun. 12-13, 1989, p. 494.
"Properties of LPCVD Titanium Nitride for ULSI Metallization", by A. Sherman, Proceedings of the 6th International IEEE VLSI Multilevel *Interconnection Conference*, Jun. 12-13, 1989, p. 497.
"Titanium Nitride Thin Films: Properties and APCVD Synthesis Using Organometallic Precursors", by R. M. Fix et al., *Proceedings of the Materials Research Society Fall Symposium*, Boston, MA, 1989.
"Synthesis of Thin Films by Atmospheric Pressure Chemical Vapor Deposition Using Amido and Imido Titanium (IV) Compounds as Precursors", by R. M. Fix et al., *Chemical and Materials*, vol. 2(3), 1990, pp. 235-241.

*Primary Examiner*—Brian E. Hearn
*Assistant Examiner*—T. N. Quach
*Attorney, Agent, or Firm*—Eugene E. Pacher

[57] ABSTRACT

Disclosed is a method that comprises selective deposition of titanium nitride TiN$_x$ on III-V compound semiconductor material. The TiN$_x$ can advantageously be used as contact metal. Exemplarily, deposition is by rapid thermal low pressure (RT-LP) MOCVD using dimethylamidotitanium with H$_2$ carrier gas.

8 Claims, 5 Drawing Sheets

METHOD OF MAKING AN ARTICLE COMPRISING A TINX LAYER

This invention pertains to methods of making semiconductor devices, including III-V-based electronic and opto-electronic semiconductor devices. More particularly, it pertains to such methods that comprise formation of a $TiN_x$ layer on a semiconductor surface.

BACKGROUND OF THE INVENTION

Titanium nitride ($TiN_x$, $x \sim 1$) films have properties that make such films of interest in semiconductor device manufacture. Among the properties are hardness approaching that of diamond, a high melting point (about 3000° C.), inertness to many chemicals and solvents, and good electrical conductivity. $TiN_x$ films are used as diffusion barriers in Si-based devices (typically between a Ti-silicide layer adjacent to the Si substrate and the W ohmic contacts). $TiN_x$ films are also used in the multilayer gate metalization in GaAs/AlGaAs HEMT devices, and in Schottky and ohmic metalization schemes in GaAs device technology.

Prior art $TiN_x$ films have been deposited by reactive sputtering of Ti in a $Ar-N_2$ atmosphere, by evaporation of Ti in the presence of $N_2$ (followed by a 700°-900° C. inert gas anneal), and by reduction of a $TiSi_2$ layer by $NH_3$ at 900° C. Chemical vapor deposition (CVD) techniques have also been previously used to deposit $TiN_x$. The CVD techniques used were atmospheric pressure CVD (APCVD) and low pressure CVD (LPCVD). See J. Klein et al., *Proceedings of the 6th International IEEE VLSI Multilevel Interconnection Conference*, p. 494 (1989); and A. Sherman, ibid, p. 497.

Although CVD of $TiN_x$ films is applicable to Si-based devices, it is of particular interest in conjunction with III-V compound semiconductor technology, due to the sensitivity of III-V-based devices to surface degradation during processing. The $TiN_x$ films typically are deposited by reacting $TiCl_4$ and $NH_3$ at 450°-700° C. at pressures from 0.1-0.3 Torr, and typically contain substantial amounts of carbon and/or $O_2$.

Recently, R. M. Fix et al (*Proceedings of the Materials Research Society Fall Symposium*, Boston, Mass. 1989); and *Chemical and Materials*, Vol. 2(3), p. 235, 1990) have, inter alia, reported the deposition of $TiN_x$ by APCVD at 200° C. on Si, vitreous carbon, glass, stainless steel and plastic substrates using metalorganic CVD (MOCVD).

Prior art techniques for $TiN_x$ deposition result in "blanket" deposition, namely, deposition on all (appropriately oriented) exposed portions of the substrate. Consequently, prior art $TiN_x$ layers generally are patterned subsequent to their deposition. For reasons that include process simplification and reduced cost, it would be highly desirable to have available a technique for selectively depositing $TiN_x$ on a semiconductor body. It would be particularly desirable if such a technique did not comprise a high temperature (e.g. >500° C.) step, and did not expose the semiconductor body to energetic particles capable of damaging the surface. This application discloses such a method.

SUMMARY OF THE INVENTION

In a broad aspect, the invention is a method of making an article that comprises a semiconductor device comprising a patterned $TiN_x$ layer. In preferred devices the Ti/N ratio is about 1, typically in the approximate range 0.9-1.1. By "$TiN_x$" herein we do not only mean material that contains, in addition to $TiN_x$, unavoidably or inadvertently present impurities (e.g., carbon and/or material that contains oxygen, but also that contains an intentionally introduced dopant (e.g., Zn or Si). In preferred embodiments of the invention the layer contains at least 55 mole % $TiN_x$.

More specifically, the method comprises providing a III-V compound semiconductor body having a major surface, forming a patterned first material layer (e.g. $SiO_2$) on the surface such that a predetermined portion of the surface is not covered by the first material layer, and contacting the surface with an atmosphere that comprises a Ti- and N-containing metalorganic gaseous precursor (e.g. dimethylamidotitanium, to be referred to as DMATi). The method further comprises heating at least a portion of the semiconductor body to a temperature in the range 250°-500° C. (preferably lower than 475° C.) for a short time (less than 300 seconds), preferably not more than 180 seconds; (preferably at least 10 seconds). I have discovered that the atmosphere, temperature and heating time can be selected such that $TiN_x$ is deposited on the predetermined portion of the surface, and such that substantially no $TiN_x$ is deposited on the first material layer. Preferred embodiments of the invention involve Cl-free chemistry and thus are free of the difficulties attendant upon prior art use of a Cl-containing precursor in conjunction with InP and other III-V compound semiconductors. However, $TiN_x$ films produced according to the invention can be readily dry etched in, e.g., a F-containing RF plasma.

Further processing steps are contemplated, including steps that typically are carried out subsequent to deposition of the patterned $TiN_x$ layer. Exemplarily, they include a RTP (rapid thermal processing) sintering step carried out under $N_2$ (or other appropriate atmosphere) at a temperature in the range 300°-550° C. Other exemplary processing steps are metallization, photolithography, etching, dicing, encapsulating, testing and packaging steps. Optionally, the method comprises a pre-cleaning step that comprises heating the semiconductor body in a protective atmosphere (e.g., comprising tertiarybutylphosphine, referred to also as TBP) before $TiN_x$ deposition.

DETAILED DESCRIPTION OF SOME PREFERRED EMBODIMENTS

Figure 1:
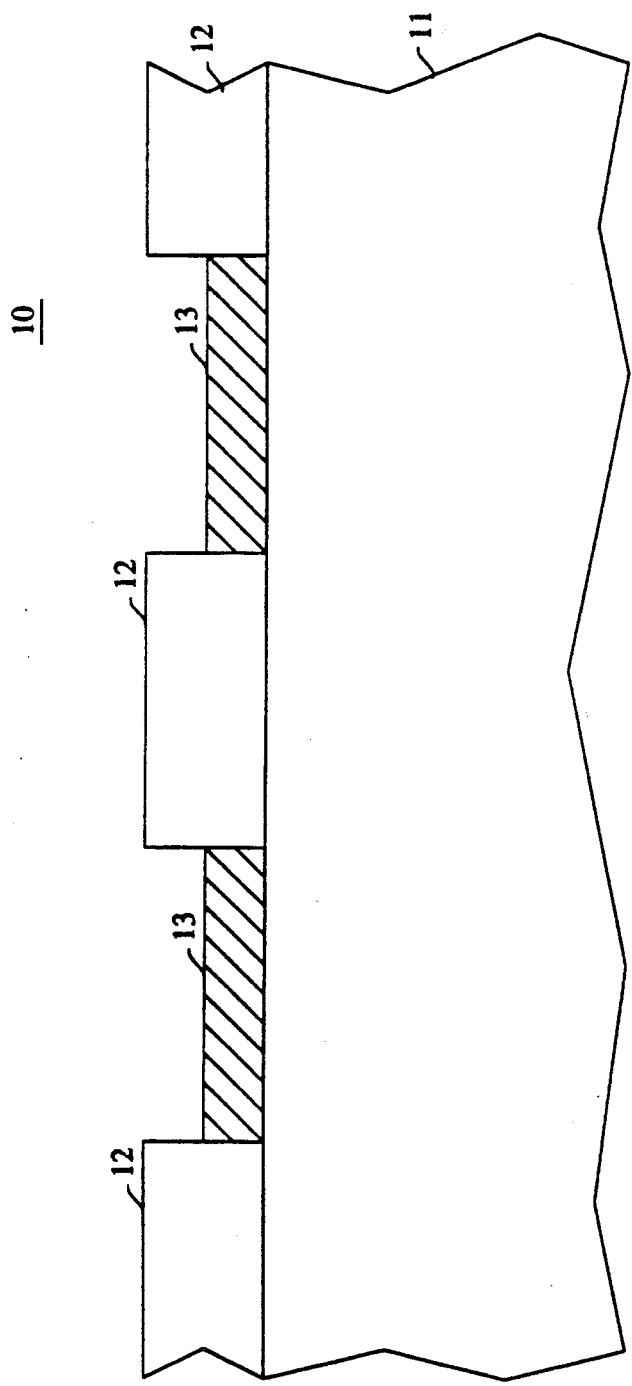
FIG. 1 schematically depicts a portion of an article according to the invention after selective deposition of $TiN_x$.

FIG. 1 schematically depicts a portion of an exemplary article according to the invention 10 at an intermediate stage of the manufacturing sequence. Exemplary, the finished article is an IC chip or an opto-electronic device such as a semiconductor laser. Numeral 11 refers to the III-V semiconductor body (e.g., GaAs, InP, InAs, GaP, related ternary and quaternary materials such as AlGaAs and InGaAsP, respectively), numeral 12 refers to the patterned first material (typically SiO2 or silicon nitride, but not excluding other suitable anorganic insulator material) layer, and 13 refers to the patterned $TiN_x$ layer. Portions 13 can serve as electrical contacts either as shown or as part of a multilayer contact that involves deposition of one or more further layers (e.g., Pt).

The invention is advantageously practiced in apparatus that makes possible contacting a given semiconductor body with an appropriate atmosphere at a predetermined pressure, and rapidly heating the body to a predetermined temperature, the conditions selected such that the desired chemical reaction (e.g., deposition of $TiN_x$) occurs at an appreciable rate substantially only during the time the body is at the predetermined temperature. Such apparatus will be referred to as "rapid thermal" (RT) deposition apparatus. If the deposition method that is used is MOCVD, then the apparatus will be referred to as RT-MOCVD apparatus. For the sake of specificity, most of the discussion below will be in terms of deposition of $TiN_x$ on InP. The conditions applicable to deposition on other III-V semiconductors typically will be similar to those applicable to InP, such that at most a minor amount of experimentation will be required to determine conditions suitable for deposition of $TiN_x$ on any given III-V semiconductor in any appropriate RT-MOCVD reactor.

The Ti- and N-containing organometallic precursor used was DMATi (commercially available from American Cyanamid, molecular formula $[(CH_3)_2N]_4Ti$, molecular weight 224.2, boiling point 50° C.), but other Ti- and N-containing organometallics (e.g. diethylamido titanium) are also expected to be useful in the practice in the invention, albeit typically at somewhat different optimal conditions.

The RT-MOCVD reactor used by me comprises two sets (upper and lower) of high power halogen-tungsten lamps capable of rapidly heating a semiconductor wafer to the desired processing temperature, with 90% of the desired temperature difference typically reached in less than 5 seconds. Ultrahigh purity $H_2$ was used as a carrier gas, although other gases (e.g. $N_2$ or Ar) could also be used. The $H_2$/DMATi gas flow ratio typically was in the range 2:1-15:1.

Figure 2:
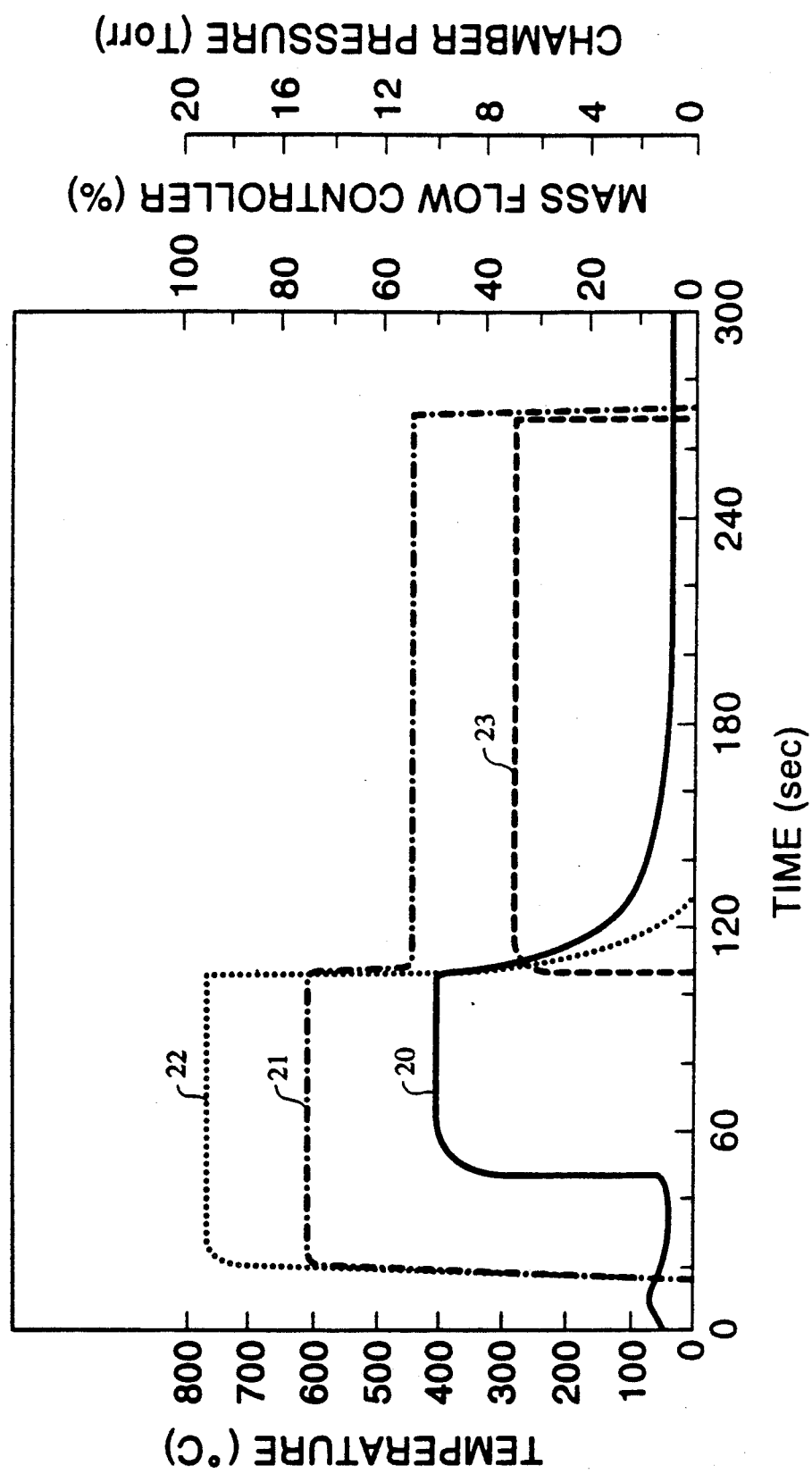
FIG. 2 shows exemplary process parameters as a function of time.

FIG. 2 shows a typical deposition cycle plot of temperature (numeral 20), total chamber pressure (21), and mass flow controller (MFC) conditions (22 for the DMATi+$H_2$ MFC; 23 for the flushing gas MFC). The DMATi and flushing gas MFCs have a maximum flow rate of 500 scc/minute and 5000 scc/minute, respectively.

After introduction of the semiconductor sample (e.g., an InP wafer) into the reactor chamber and prior to admission of the precursor gas into the chamber the pressure was reduced to about $5 \times 10^{-6}$ Torr. Subsequently, the DMATi+$H_2$ mixture (50:450 scc/min) was injected and the pressure stabilized before turning on the heating lamps. Simultaneously with turning off the lamps, the DMATi+$H_2$ MFC was closed and the flushing gas ($H_2$ or $N_2$) MFC was opened. The bubbler and tubing used to transport the gaseous DMATi from the bubbler to the reactor were heated to a temperature in the range 40°-80° C.

A $TiN_x$ film was selectively deposited as follows. On a semi-insulating 50 mm diameter InP substrate was grown a 0.5 $\mu$m layer of p-$In_{0.53}Ga_{0.47}As$ by MOCVD, followed by growth of a 0.3 $\mu$m layer of $SiO_2$ by RT-LPCVD using 2% $SiH_4$ in Ar and $O_2$. By conventional photolithography and wet etching the $SiO_2$ layer was patterned such that semiconductor surface regions of various dimensions were exposed. After completion of the patterning the sample was re-loaded into the reactor and a 0.3 $\mu$m $TiN_x$ film deposited substantially as described above. Exemplary, the pressure was in the range from 10-25 Torr, and the temperature was 420° C. Under these conditions deposition was highly selective, with substantially no $TiN_x$ deposited on the $SiO_2$.

The inventive process not only can result in selective deposition but $TiN_x$ films produced according to the invention typically exhibit excellent step coverage, even of very small (e.g., $60 \times 60$ nm) features with aspect ratios greater than unity. Since $TiN_x$ films according to the invention will, inter alia, desirably be part of metalization schemes that involve via holes of very small diameter, the excellent step coverage of such films is a significant advantage of the inventive method.

Preferred embodiments of the invention comprise use of an atmosphere that contains a minor amount of $NH_3$. Exemplarily, the DMATi/$NH_3$ ratio is in the range 5:1 to 15:1. Addition of $NH_3$ typically results in a reduced C content of the deposited $TiN_x$. However, $NH_3$ may not be the only additive having this effect, and addition of any additive that results in lower C and/or oxygen-content of the $TiN_x$ film is contemplated.

Optionally, the atmosphere comprises dopant precursors such as dimethylzinc, diethylzinc, trimethylgallium or trimethylaluminum. Subsequent processing of semiconductor bodies with a doped $TiN_x$ film typically comprises a heat treatment that is designed to result in diffusion of dopant atoms from the $TiN_x$ into the underlying semiconductor material, resulting in doped, or more highly doped, semiconductor material. Desirably this heat treatment involves RTP, with the temperature being less than 500° C. The optional post-deposition heat treatment is not limited to bodies with doped $TiN_x$ films thereon, and a post-deposition sintering RTP (temperature less than 550° C., time less than 600 s) in a protective (e.g., containing TBP or other material containing an appropriate column V element) atmosphere or an inert atmosphere (e.g., $N_2$) is contemplated.

Figure 3:
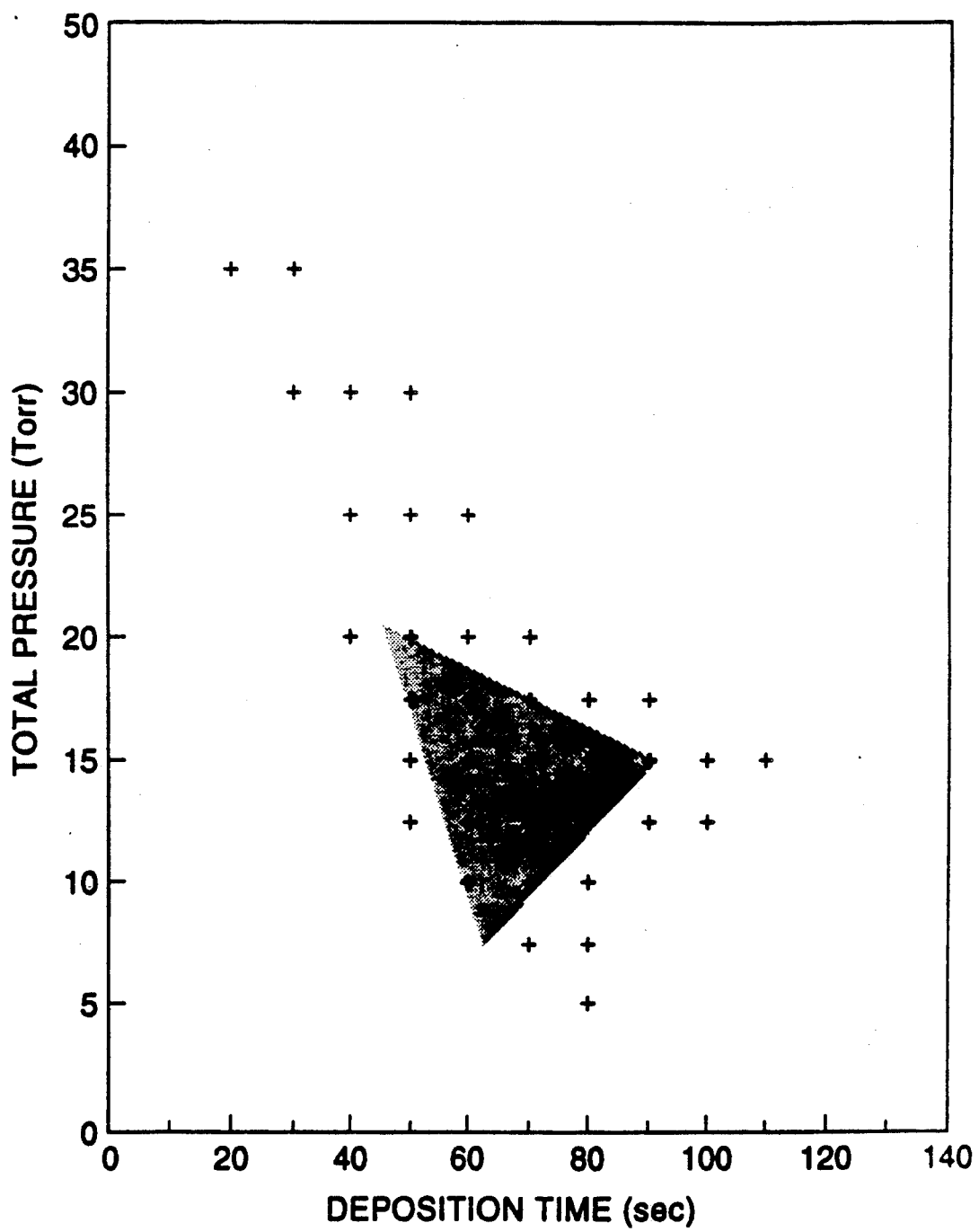
FIG. 3 shows exemplary pressure and deposition time combinations that were found to yield $TiN_x$ deposition.

FIG. 3 summarizes total pressure and deposition time conditions that [for a deposition temperature of 420° C. and DMATi bubbler temperature of 80° C. in a particular, commercially available reactor (A. G. Associates CVD 800 TM)] yielded $TiN_x$ deposition on a InP substrate, with the dark triangular region yielding preferred results. Films in this area had uniform and continuous structure, had a Ti/N ratio in the range 0.9-1.1, carbon and oxygen concentrations lower than 35% and 8%, respectively, internal compressive stress lower than $-1.5 \times 10^{10}$ dynes/cm$^2$, and dry etch rates in the range 7-10 nm/min. in a ECR/RF reactor using $SF_6$. Those skilled in the art will recognize that these results are, at least to some degree, equipment specific. Thus, it will typically be necessary to establish the optimum parameters for given apparatus by means of some minor routine experimentation.

Figure 4:
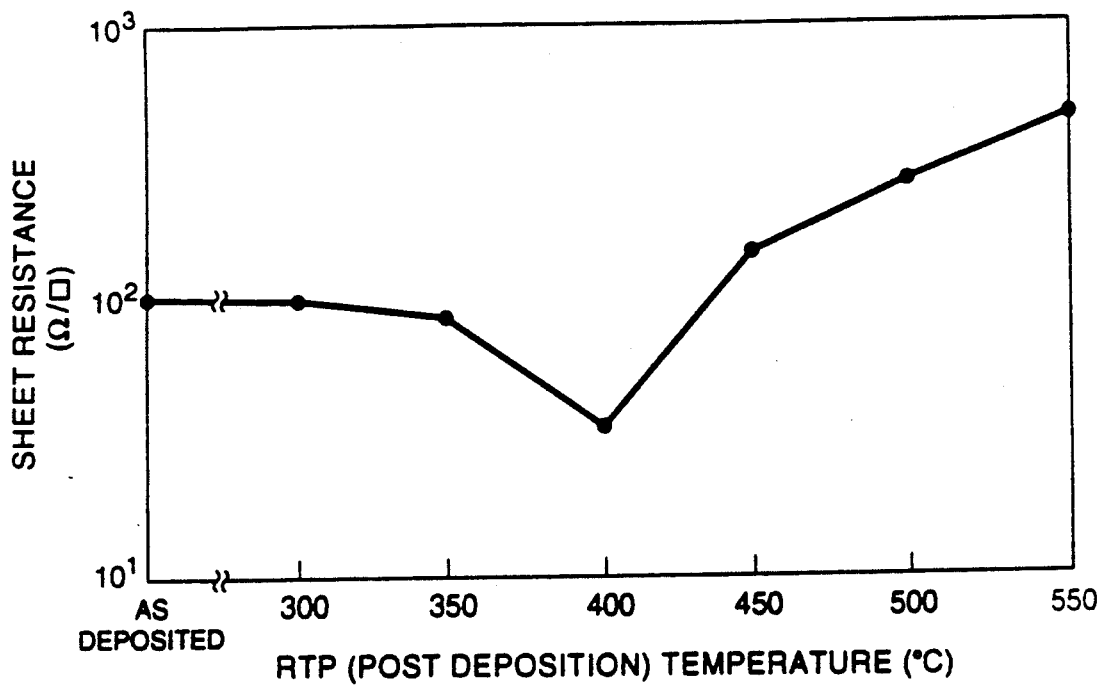
FIGS. 4 and 5 show exemplary data on sheet resistance and contact resistance of $TiN_x$ films produced according to the invention.

FIG. 4 shows exemplary data on sheet resistivity of $TiN_x$ film deposited according to the invention, as a function of the (post deposition) RTP temperature. The $TiN_x$ films were deposited onto p-$In_{0.53}Ga_{0.47}As$ ($1.2 \times 10^{18}$ cm$^{-3}$Zn) at 420° C. and a total pressure of 15 Torr. The post deposition RTP time was 30 s.

Figure 5:
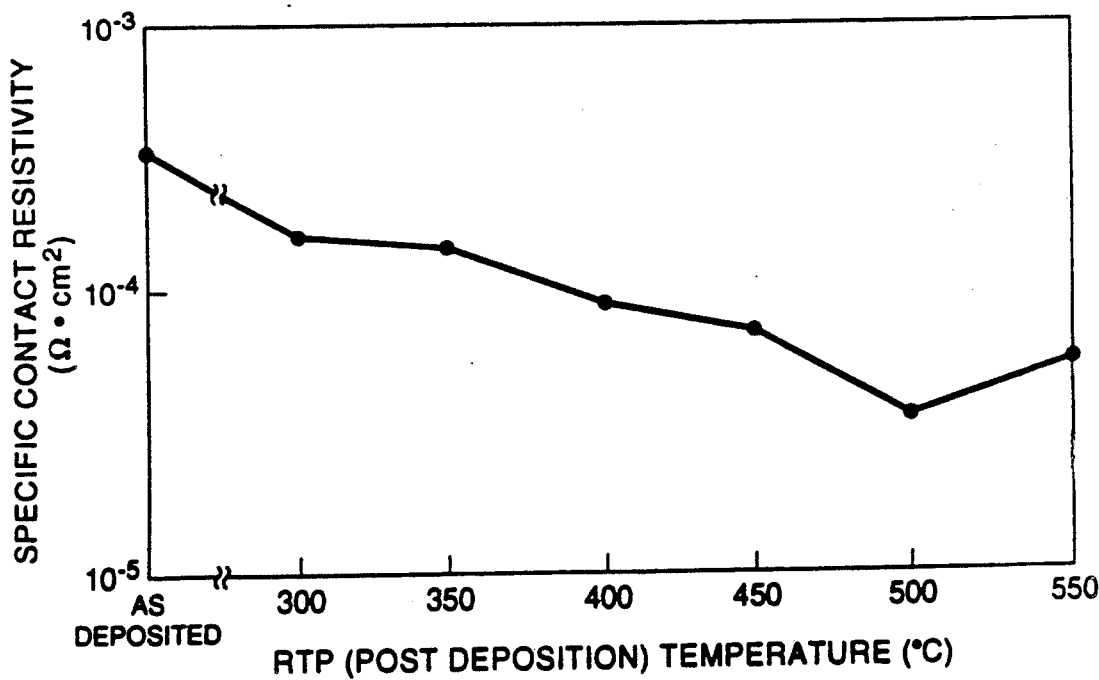

FIG. 5 similarly shows exemplary data on the specific contact resistivity observed in the above described $TiN_x$/substrate combination. The data of FIGS. 4 and 5 indicates that post deposition annealing above 550° C. typically is not desirable. It has also been observed that annealing of the above combination above 550° C. results in degradation of the ohmic nature of the metal/semiconductor contact.

Figure 6:
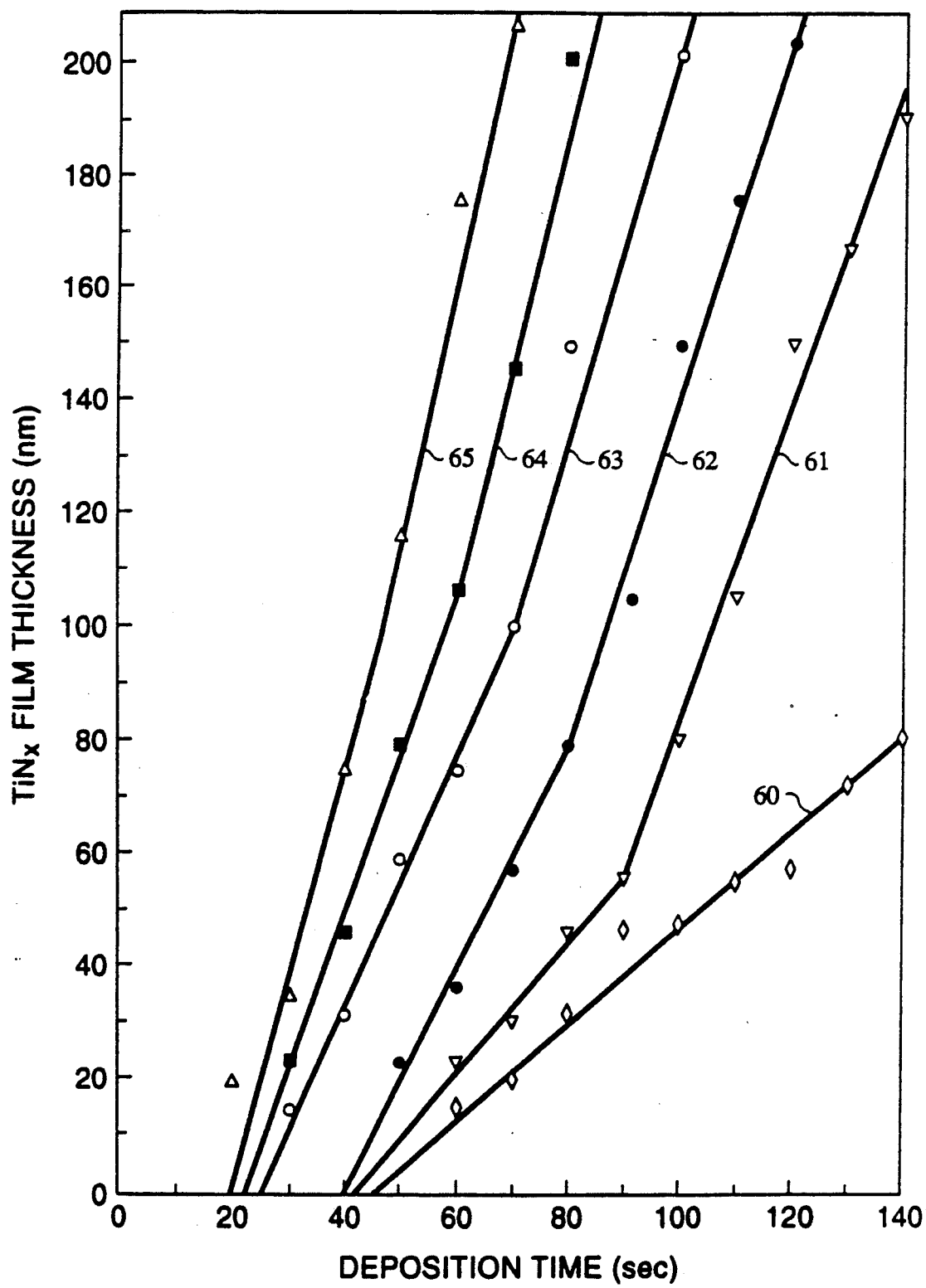
FIG. 6 depicts exemplary data on film thickness as a function of deposition time.

FIG. 6 shows exemplary data on $TiN_x$ film thickness vs. deposition time. The substrate was InP, the deposition temperature was 420° C., and the bubbler temperature was 80° C. Curves 60-65 correspond to a total RT-LPMOCVD chamber pressure of 5, 10, 15, 25, 30 and 35 Torr, respectively.

The inventive deposition process is advantageously incorporated into a single wafer integrated device manufacturing process of the type currently being developed by the industry. An optional part of such a process is an in-situ RTP wafer cleaning step prior to $TiN_x$ film deposition. Such a step advantageously comprises use of an appropriate protective atmosphere, exemplarily comprising tertiarybutylphosphine if the wafer contains P (e.g., InP), or tertiarybutylarsine if the wafer contains As (e.g., GaAs). In the former case the temperature preferably is at most 700° C., in the latter case it preferably is less than 1000° C.

I claim:

1. Method of making an article comprising a semiconductor device, the method comprising
   a) providing a semiconductor body having a major surface;
   b) forming on the surface a patterned titanium nitride ($TiN_x$, $0.9 \leq X \leq 1.1$) layer;
   c) carrying out one or more further steps towards completion of the article;
   CHARACTERIZED IN THAT
   d) the semiconductor body is a III-V compound semiconductor body; and
   e) step b) comprises forming a patterned first material layer on the surface, such that a predetermined portion of the surface is not covered by the first material layer; and further comprises contacting the major surface with an atmosphere that comprises a Ti- and N-containing metalorganic gaseous precursor, heating at least a portion of the semiconductor body to a temperature in the range 250°-500° C. for at most 300 seconds, the atmosphere, temperature and heating time selected such that said $TiN_x$ is deposited on the predetermined portion of the surface, and substantially no $TiN_x$ is deposited on the first material layer.

2. Method of claim 1, wherein the Ti- and N-containing precursor is dimethylamidotitanium (DMATi), wherein the first material layer is a $SiO_2$ layer or a silicon nitride layer, and wherein said $TiN_x$ layer contains at least 55 mole % $TiN_x$.

3. Method of claim 1, wherein the atmosphere further comprises $NH_3$.

4. Method of claim 1, wherein the atmosphere further comprises a dopant precursor such that the patterned $TiN_x$ layer is a doped patterned layer, and step c) comprises heating the body with the doped patterned layer thereon to a temperature effective for causing diffusion of dopant from the doped patterned layer into the semiconductor body, said temperature being below 550° C.

5. Method of claim 1, comprising, prior to step b, heating the semiconductor body in a protective atmosphere to a temperature of at most 1000° C.

6. Method of claim 5, wherein the semiconductor body comprises P, the protective atmosphere comprises tertiarybutylphosphine, and the temperature is at most 700° C.

7. Method of claim 5, wherein the semiconductor body comprises As and the protective atmosphere comprises tertiarybutylarsine.

8. Method of claim 1, wherein step c) comprises depositing a metal onto the patterned $TiN_x$ layer.

* * * * *